United States Patent
Erlbacher

(10) Patent No.: US 9,865,763 B2
(45) Date of Patent: Jan. 9, 2018

(54) METHOD, A SEMICONDUCTOR DETECTOR, AND A DETECTOR ARRANGEMENT, FOR THE DETECTION OF SUNLIGHT

(71) Applicant: FRAUNHOFER-GESELLSCHAFT ZUR FOERDERUNG DER ANGEWANDTEN FORSCHUNG E.V., Munich (DE)

(72) Inventor: Tobias Erlbacher, Poxdorf (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 14/967,686

(22) Filed: Dec. 14, 2015

(65) Prior Publication Data
US 2016/0172524 A1    Jun. 16, 2016

(30) Foreign Application Priority Data
Dec. 16, 2014  (DE) .................. 10 2014 018 722

(51) Int. Cl.
*G01T 1/24*    (2006.01)
*H01L 31/103*    (2006.01)
(Continued)

(52) U.S. Cl.
CPC ....... *H01L 31/1037* (2013.01); *B60H 1/0075* (2013.01); *G01J 1/02* (2013.01);
(Continued)

(58) Field of Classification Search
CPC ......... G01T 1/24; G01T 1/2928; G01T 1/026; H04N 5/32; H01L 27/14692
See application file for complete search history.

(56) References Cited

U.S. PATENT DOCUMENTS

| 3,925,244 | A |  | 12/1975 | Nagasawa et al. ........... 250/372 |
| 5,093,576 | A | * | 3/1992 | Edmond ................ H01L 31/103 250/370.01 |

(Continued)

FOREIGN PATENT DOCUMENTS

DE    10 2012 022 052 A1    5/2014 ................ G01J 1/42

OTHER PUBLICATIONS

Nava et al. "Silicon Carbide and its use as a radiation detector material", IOP Publishing, Meas. Sci. Technol. 19 (2008), p. 1-25.*

(Continued)

*Primary Examiner* — David Porta
*Assistant Examiner* — Mamadou Faye
(74) *Attorney, Agent, or Firm* — Renner Kenner Greive Bobak Taylor & Weber

(57) ABSTRACT

The present invention concerns a method for the detection of sunlight with a detector arrangement that delivers an output signal as a function of incident sunlight. In the method a detector arrangement is deployed with an SiC-semiconductor detector, which is only sensitive to the UV-component of the incident sunlight. By the deployment of such a detector arrangement a disturbance of the sunlight detection by artificial light sources is to a large extent avoided, so that a more reliable detection of the sunlight is enabled.

21 Claims, 2 Drawing Sheets

(51) Int. Cl.
*G01J 1/02* (2006.01)
*G01J 1/42* (2006.01)
*H01L 25/03* (2006.01)
*H01L 29/161* (2006.01)
*H01L 27/144* (2006.01)
*H01L 31/0312* (2006.01)
*B60H 1/00* (2006.01)
*H01L 31/0216* (2014.01)
*H01L 31/105* (2006.01)
*H01L 27/148* (2006.01)

(52) U.S. Cl.
CPC ............... *G01J 1/42* (2013.01); *G01J 1/429* (2013.01); *H01L 25/03* (2013.01); *H01L 27/1446* (2013.01); *H01L 29/161* (2013.01); *H01L 31/02161* (2013.01); *H01L 31/02162* (2013.01); *H01L 31/0312* (2013.01); *H01L 31/103* (2013.01); *H01L 31/105* (2013.01); *G01J 2001/4266* (2013.01); *H01L 27/148* (2013.01); *H01L 2924/0002* (2013.01)

(56) References Cited

U.S. PATENT DOCUMENTS

| | | | |
|---|---|---|---|
| 5,594,236 A | 1/1997 | Suzuki et al. | 250/214.1 |
| 6,246,045 B1* | 6/2001 | Morris | G01J 1/04 250/216 |
| 6,666,493 B1 | 12/2003 | Naik | 296/97.4 |
| 9,431,557 B2* | 8/2016 | Knigge | H01L 31/022408 |
| 2005/0139753 A1* | 6/2005 | Park | H01L 31/02161 250/214.1 |
| 2007/0222923 A1* | 9/2007 | Wang | G02F 1/136209 349/110 |
| 2011/0024768 A1 | 2/2011 | Veliadis | 257/77 |

OTHER PUBLICATIONS

Badila et al. Lift-off technology for SiC UV detectors, www.elsevier.com/locate/diamond, Diamond and related Materials 9 (2000) 994-997.*
Allen "Depletion Region of a PN Junction" ECE 4430, Analog Integrated Circuits and Systems p. 1-2.1-1.2.8 ( May 11, 2000).*
Chen et al., *High-performance 4H-SiC-based ultraviolet p-i-n photodetection*; J. Appl. Phys. 102; 2007; pp. 024505-1-024505-4.
Vert et al., *Silicon Carbide Photomultipliers and Avalanche Photodiode Arrays for Ultraviolet and Solar-blind Light Detection*; IEEE Sensors 2009 Conference; pp. 1893-1896.

* cited by examiner

METHOD, A SEMICONDUCTOR DETECTOR, AND A DETECTOR ARRANGEMENT, FOR THE DETECTION OF SUNLIGHT

TECHNICAL FIELD OF APPLICATION

The present invention concerns a method for the detection of sunlight with a detector arrangement, which delivers an output signal as a function of incident sunlight, together with a semiconductor detector that is deployed in the method.

The detection of incident sunlight can be required, for example, in applications in which technical devices are controlled as a function of the sunlight, or the angle of incidence of the sunlight. Examples of such applications are air conditioning systems in motor vehicles, for the control of which the intensity of the sunlight incident on the windscreen and windows is used in addition to the internal temperature.

PRIOR ART

Thus from U.S. Pat. No. 6,666,493 B1, for example, a detector arrangement for the detection of sunlight is known, with the aid of which an electronically controllable darkening mechanism in the windscreen is regulated. Here the sunlight falling on the face of the driver is detected with an infrared camera, whose signal activates the darkening mechanism in the windscreen.

U.S. Pat. No. 5,594,236 A describes a sunlight sensor that is embodied as a semiconductor device. The said sunlight sensor is preferably deployed for purposes of determining the angle of incidence of sunlight in motor vehicles in order to regulate the air conditioning system. Here Si, GaAs or InP are cited as examples of suitable semiconductor materials for the detection of sunlight. Semiconductor detectors made from these materials are sensitive in the visible spectral range of the sunlight.

In addition to the detectors for the detection of sunlight, UV detectors are also known from the prior art, which are designed to be unaffected by sunlight and are designated as "solar-blind" UV detectors. Thus, for example, X. Chen et al., "High-performance 4H—SiC-based ultraviolet p-i-n photodetector", J. Appl. Phys. 102 (2007), pages 024505-1 to 024505-4, describes a UV semiconductor detector made from SiC material, in particular from 4H—SiC, for the detection of UV radiation in the wavelength range from 240 nm to 350 nm. As a result of the band gap of the semiconductor of about 3 eV light quanta with a wavelength above 400 nm are not absorbed. This detector has already been designated by the authors as "solar-blind". With the deployment of additional filters the wavelength ranges of the sunlight above about 300 nm can at the same time also be masked out. A. Vert et al., "Silicon carbide photomultipliers and avalanche photodiode arrays for ultraviolet and solar-blind light detection", IEEE Sensors 2009 Conference, pages 1893 to 1896, also describes such a solar-blind UV-detector made from SiC.

However, the solutions listed in the introduction for the detection of sunlight do not enable sufficient differentiation between sunlight and other light sources, such as, for example, street lamps, or the headlamps of oncoming vehicles. The same is also true, of course, for other light sources such as, for example, incandescent bulbs, halogen lamps, energy-saving lamps, LEDs, or green and red laser pointers, which can similarly interfere with conventional sunlight detection.

DE 24 21 063 C3 describes a method for the detection of sunlight in which a detector based on tin (IV)-oxide is deployed, so as to selectively register UV light in the wavelength range from only 320 to 360 nm.

The object of the present invention consists in specifying a method for the detection of sunlight, which is not disturbed by other light sources, and has a high sensitivity for sunlight detection.

PRESENTATION OF THE INVENTION

The object is achieved with the method according to patent claim 1. Patent claim 13 specifies a semiconductor detector designed for the method, while patent claim 20 specifies an advantageous detector arrangement for the execution of the method. Advantageous configurations of the method, the semiconductor detector and the detector arrangement are the subject matter of the dependent patent claims, or can be taken from the following description and examples of embodiments and applications.

In the method here proposed a detector arrangement is deployed that is only sensitive to a UV-component of the incident sunlight and delivers an output signal. The sunlight is then detected on the basis of the output signal of the detector arrangement, which is a measure for the intensity of the incident sunlight. The method is characterized in that in the detector arrangement at least one SiC-semiconductor detector is deployed, in which the lower of two semiconductor regions, which form the pn-junction of the semiconductor detector, has a dopant concentration of $<1*10^{15}$ cm$^{-3}$, preferably $<5*10^{14}$ cm$^{-3}$, and has a thickness that is greater than 50% of the width of the space-charge zone in thermodynamic equilibrium, i.e. with 0 V voltage on the pn-junction, with thickness not restricting the space-charge zone of this semiconductor region. The thickness of the lower semiconductor region is preferably at least 75%, particularly preferably at least 100%, of the width of the space-charge zone in thermodynamic equilibrium, as would occur with a non-restrictive thickness of this semiconductor region. By "non-restrictive thickness" is here to be understood a thickness of the semiconductor region that exceeds the extent, i.e. width, of the space-charge zone.

The pn-junction of the SiC-semiconductor detector is thus in a manner known per se formed by two semiconductor regions located one above another, which in the present patent application are designated as the upper and lower semiconductor regions. The upper semiconductor region thereby represents the semiconductor region of the pn-junction facing towards the radiation that is to be detected.

By the detection of just the UV-component of the sunlight, the detection is no longer disturbed by other artificial light sources, whose UV-component as a rule only amounts to less than 1% of the emitted light intensity. The sunlight detection can thus take place with a higher reliability than in the case of detectors that are sensitive to the visible wavelength range of the sunlight spectrum. The proposed sunlight detection can also be achieved significantly more simply than a spectral analysis with the aid of a spectral analyser. By the selection of a SiC-semiconductor detector with the specified low dopant concentration in conjunction with a sufficiently large thickness of the lower semiconductor region, which is preferably grown by means of epitaxy onto a highly doped substrate, a large ratio of the photons in the wavelength range between 300 nm and 330 nm is absorbed in the space-charge zone of the pn-junction. This leads to a particularly high sensitivity of the detector in this wavelength range, and thus to the high sensitivity desired for sunlight detection. Here the lower semiconductor region preferably has a thickness of at least 1.7 µm.

By the application of a block voltage on the pn-junction it is also possible, with a sufficiently large thickness of the lower semiconductor region, to further increase the sensitivity to wavelengths between 330 nm and 350 nm (even up to 380 nm). However, this is at the expense of accuracy (dark leakage current).

A SiC-semiconductor detector already has a significantly higher sensitivity in the ultraviolet spectral range compared with that in the visible and infrared spectral range. For sunlight detection according to the proposed method no additional filter is any longer required ahead of the detector. Needless to say, however, in addition, such a filter, or an appropriate filter arrangement, can also be deployed. The utilisation of an SiC-semiconductor detector for sunlight detection has the advantage that such detectors have a high stability with respect to UV radiation, together with low electron noise by virtue of the high band gap. This allows the operation of these detectors at room temperature, whereas in the case of other sensor materials cooling can be necessary, depending upon the application. Thus, such detectors deliver a higher resolution, that is to say a lower dark leakage current, at room temperature than sunlight detectors of known art that are sensitive in the visible spectral range, in particular those made of silicon. As a result of the high resolution capability of a SiC-semiconductor detector a more accurate scattered light measurement of sunlight is in principle also possible, that is to say, measurement at greater scatter angles than is the case for other sunlight detectors. Operation of a SiC-semiconductor detector is also possible at high temperatures (above 200° C.), in contrast to uncooled silicon detectors. High operating temperatures inevitably ensue in the case of direct irradiation by sunlight from the absorption of solar energy in the sensor, or in the periphery of the sensor.

In contrast to the utilisation in a manner of known art of SiC-semiconductor detectors as UV detectors, which are designed to be solar-blind, in the present method it is actually the detectability of the UV-component of sunlight that is utilised, in order to deploy such a detector as a sunlight detector.

In a particularly advantageous configuration of the proposed method an SiC-semiconductor detector of the polytype 4H—SiC is deployed. This semiconductor material has a conduction band edge at 3.28 eV and thus has an absorption edge at approx. 378 nm, which is particularly advantageous for the detection of just the UV-component of sunlight that is proposed here.

The upper semiconductor region preferably has a dopant concentration of $>5*10^{18}$ cm$^3$, particularly preferably $>1*10^{19}$ cm$^{-3}$. In this manner a good ohmic contact is achieved for the electrical contacts. The layer thickness of the upper semiconductor region is preferably chosen to be between 1.5 µm and 3 µm, particularly preferably between 2 µm and 3 µm. With this layer thickness short wavelength light with a wavelength of less than 300 nm is preferably absorbed in the upper semiconductor region, so that the electron-hole pairs thereby generated already recombine there without contributing to the sensor signal. In an advantageous configuration the upper semiconductor region is created by means of ion implantation. This improves the absorption in the region of the band edge on the basis of Z1/2 defects.

For a further improvement of the efficiency, the SiC-semiconductor detector can be provided with an anti-reflection coating, which is designed for a wavelength range between 300 and 380 nm. For this purpose the upper semiconductor region can, for example, be coated with an anti-reflection coating of $SiO_2$, which has a thickness in the range between 50 nm and 66 nm. However, the detector can also be deployed without an anti-reflection coating.

In the proposed method the detector can be combined by means of a suitable construction technique with a silicon CMOS-chip. It can be mounted on a circuit board in a housed or an unhoused.

In a further advantageous configuration the SiC-semiconductor detector sensitive to the UV-content of the sunlight is combined with a further detector, which is sensitive to the visible and/or infrared spectral range of the sunlight, and preferably detects a relatively broad spectrum in the visible spectral range. By a suitable evaluation of the output signals from the two detectors a differentiation can then also be made between the direct irradiation of sunlight, the irradiation of an artificial light source emitting UV light, and the irradiation of an artificial light source emitting only in the visible spectral range. In the case of direct irradiation of sunlight that has not been filtered by a glass disk, both detectors deliver a corresponding output signal. If an output signal is delivered just in the visible spectral range, this can originate either from an artificial light source, or from sunlight that has passed through a glass disk to fall onto the detector, and thus no longer has any UV-component. If just UV light is detected, then this must inevitably originate from an artificial UV light source. Here the incidence of the light from the different light sources can also be quantified with an appropriate calibration of the detectors. The detector that is sensitive to the visible spectral range can also be fitted with one or a plurality of filters, which block, or severely weaken, the UV-component. For this detector it is possible to deploy semiconductor detectors based on, for example, Si, GaP or GaAs.

The detector arrangement deployed in the method can also have a detector array made up from appropriate detectors, so as to implement by this means a pixel array for the purpose of spatially resolved measurements, i.e. for the purpose of locating the detected light, or the light source. Here the detectors last mentioned, which are sensitive to the visible and/or infrared spectral ranges, can also be combined as required with the SiC-semiconductor detectors, which detect just the UV-component of the sunlight.

BRIEF DESCRIPTION OF THE FIGURES

In the following the proposed method is again explained in detail with by means of examples of applications and embodiments. Here.

EXAMPLES FOR CARRYING OUT THE INVENTION

Figure 1:
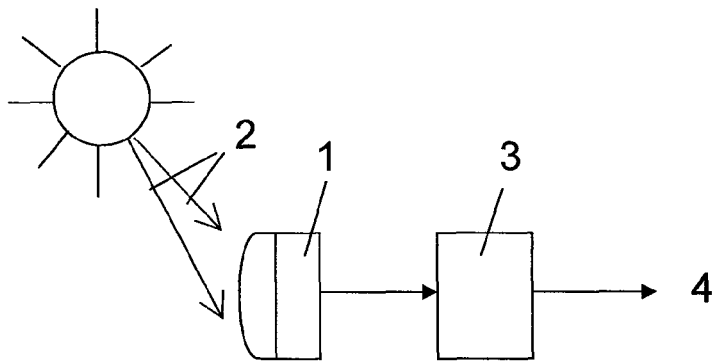
FIG. 1 shows in a highly schematic representation an example of the construction of a detector arrangement for the detection of sunlight according to the proposed method.

FIG. 1 represents a detector arrangement in a highly schematic manner, as it can be deployed in the proposed method for the detection of sunlight. The detector arrangement features in this example, an SiC-semiconductor detector 1, which by virtue of the properties of the semiconductor material is only sensitive in the wavelength range <400 nm, and thus for the UV-component of the sunlight. With incident sunlight 2 this detector 1 delivers a signal, which is suitably treated in an evaluation and amplifier circuit 3, and is prepared as an output signal 4 of the detector arrangement. The level of this output signal is a measure for the intensity of the incident solar radiation.

With a semiconductor detector based on SiC, in particular a 4H—SiC detector, which has a very simple design, even in the event of scattered incident sunlight, or additional direct or indirect irradiation by artificial light sources, the presence of solar radiation can be reliably detected. Moreover, the detector is also not disturbed by sunlight that is incident through a window, since the glazing that is usual in building construction absorbs UV light. By evaluation of the signal measured by the detector it is possible to deduce whether direct solar irradiation, or indirect solar irradiation from scattered light, is present. Moreover it is possible to measure precisely the irradiation intensity at room' temperature. In combination with a detector that is sensitive to the visible spectral range, for example a silicon detector, irradiation by artificial light or by filtered sunlight, in which the UV-component has been filtered out, can also be determined in parallel. This will be explained once again in more detail further below in conjunction with FIG. 3.

Figure 2:
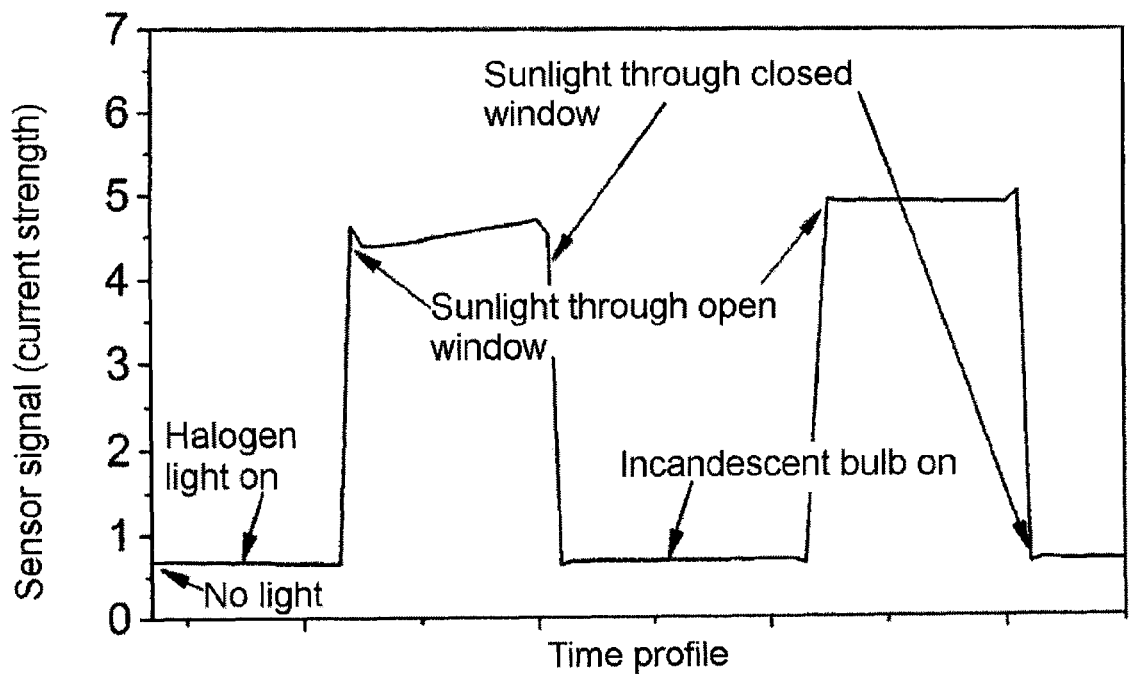
FIG. 2 shows an example of the output signal (current strength) of the detector of the proposed detector arrangement, with and without irradiation by various light sources.

FIG. 2 shows an example of measurements with a 4H—SiC-semiconductor detector in the event of incidence of various types of light. From the measurements it can be seen that artificial light sources, such as light from a halogen lamp or an incandescent lamp, do not deliver a measurement signal lying above the measurement noise. Without illumination the detector signal is dominated by the measurement noise (dark leakage current of the detector). Neither with irradiation by a halogen lamp, nor an incandescent bulb is there a significant alteration in the detector signal. If the detector is subjected to direct or indirect solar irradiation, the detector signal clearly rises. However, if the irradiation takes place through a window, the detector signal once again decreases to the value before exposure to direct or indirect solar radiation. In this example the irradiation with sunlight has been determined by indirect irradiation of the detector with sunlight in the form of scattered light that is incident through an open window on the north side of a building on a cloudy day.

Figure 3:
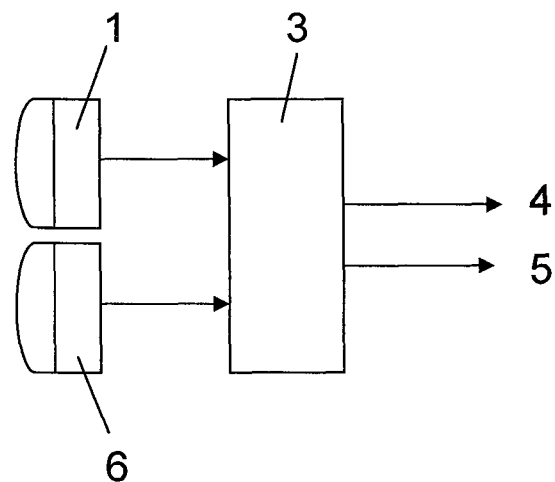
FIG. 3 shows in a highly schematic representation an example of a detector arrangement with two detectors, which are sensitive to different spectral ranges.

FIG. 3 shows in a highly schematic manner an example of a detector arrangement in which in addition to the SiC semiconductor detector 1 a detector 6 is deployed that is sensitive to the visible spectral range. The signals of both detectors are prepared in an evaluation circuit 3, in the event of detection of direct or indirect incident sunlight, in which case both detectors deliver a measurement signal, to provide an output signal 4 that represents a measure for the intensity of the sunlight. In the event of detection by just one of the two detectors on the other hand an appropriate output signal 5 is generated. By this means the insensitivity of the method to disturbances generated by other light sources can be increased further. For the construction of such a detector arrangement, the methods usual for the construction and connection of semiconductor components made of silicon are also available for silicon carbide components.

Figure 4:
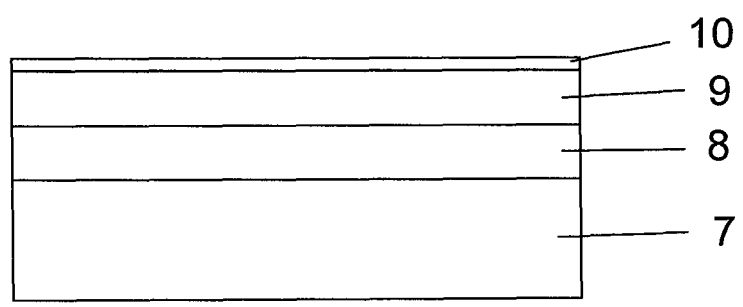
FIG. 4 shows an example of the construction of the SiC-semiconductor detector in a schematic representation.

Finally, FIG. 4 shows in a schematic representation an example of the construction of the SiC semiconductor detector that is deployed. The electrical contacts on the upper and lower faces of the detector are not represented in this figure. In this example the detector has a preferably (highly) n-doped SiC semiconductor substrate 7, on which a first doped semiconductor region 8 (designated as the lower semiconductor region) is applied or embedded, likewise preferably n-doped, with a dopant concentration of less than $5*10^{14}$ cm$^{-3}$. The thickness of the lower semiconductor region 8 is at least 1.7 µm. On this lower semiconductor region 8 is applied a second highly doped semiconductor region 9 (designated as the upper semiconductor region), preferably p+-doped with a dopant concentration of more than $5*10^{18}$ cm$^{-3}$ and a layer thickness of between 1.5 µm and 3 µm. This upper semiconductor region 9 is preferably deposited on the lower semiconductor region 8 using an epitaxy process. These two semiconductor regions 8, 9 form the pn-junction of the semiconductor detector. In this example an anti-reflection coating 10 of SiO$_2$ is applied on the upper semiconductor region 9; this has a thickness in the range between 50 nm and 66 nm. For this anti-reflection coating a material is preferably chosen, which for the wavelength range below 300 nm is no longer (completely) transparent.

The proposed method, the related SiC semiconductor detector and the related detector arrangement can be deployed in the applications for motor vehicles already mentioned in the introduction to the description. By this means, for example, for the control of an air conditioning system disturbances generated by other light sources, such as street lighting or lighting in tunnels, are avoided; these, for example, would deliver false information concerning the position of the sun. Measurement of the irradiation of light-sensitive objects with sunlight over a longer period of time is also possible with this method. Here too, the measurement is not falsified by other artificial light sources.

A further example of an application is represented by the contactless registration of an open window in daylight. In contrast to mechanical contact circuits or magnetic (contactless) monitoring components, the solution with the proposed detector arrangement allows almost any positioning in the building interior, on or away from the window that is to be monitored. Particularly when using an SiC-based sunlight detector, by virtue of its small leakage current the scattered light of the solar spectrum passing through the gap of a tilted window can also be reliably detected so as to decide whether a window is open. Any disturbance generated by other light sources in the building is thereby excluded.

Spatially resolved sunlight detection can also be implemented using an appropriately configured detector arrangement, in which the individual detectors are assembled to form a pixel sensor (identical to that of a CCD camera), in order to determine the position of the solar radiation. Combination with a detector array that is sensitive to the visible spectral range, for example a silicon CCD camera, is also possible here.

Needless to say, many other applications are also possible in which sunlight radiation is to be detected, for example, in order to reduce the probability of a false alarm or a false interpretation of other measurements as a result of solar radiation. One example is spatially resolved flame detection, as deployed in registration of the power units of anti-aircraft missiles. Here by comparing the UV light component and the visible light component a differentiation can be made between sunlight and power unit emissions. Measurement of the length of the day is also relevant for a series of commercial applications. Thus the duration of the length of the day influences the time of flowering in plant cultivation.

REFERENCE LIST

1 SiC-semiconductor detector
2 Sunlight

3 Evaluation circuit
4 Output signal
5 Further output signal
6 Detector for the visible spectral range
7 SiC-semiconductor substrate
8 Lower semiconductor region
9 Upper semiconductor region
10 Anti-reflection layer

The invention claimed is:

1. A method for the detection of sunlight, in which a detector arrangement is deployed, which is only sensitive to a UV-component of incident sunlight,
comprising:
deploying at least one SiC-semiconductor detector in the detector arrangement, in which a lower of two semiconductor regions form a pn-junction which has a dopant concentration of $<1*10^{15}$ cm$^{-3}$, and which has a thickness that is greater than 50% of the width of a space-charge zone in thermodynamic equilibrium, with the thickness not restricting the space-charge zone of this semiconductor region.

2. The method according to claim 1, further comprising: deploying as the at least one SiC-semiconductor detector, a SiC-semiconductor detector in which the thickness of the lower semiconductor region is at least 1.7 μm.

3. The method according to claim 1, further comprising: deploying as the at least one SiC-semiconductor detector, a SiC-semiconductor detector in which the dopant concentration of the lower semiconductor region is $<5*10^{14}$ cm$^{-3}$.

4. The method according to claim 1, further comprising: deploying as the at least one SiC-semiconductor detector, a SiC-semiconductor detector in which an upper of the two semiconductor regions forming the pn-junction has a thickness of between 1.5 μm and 3 μm.

5. The method according to claim 4, further comprising: deploying as the at least one SiC-semiconductor detector, a SiC-semiconductor detector in which the upper semiconductor region has a dopant concentration of $>5*10^{18}$ cm$^{-3}$.

6. The method according to claim 1, further comprising: deploying as the at least one SiC-semiconductor detector, a SiC-semiconductor detector, which carries an anti-reflection layer for a wavelength range of between 300 and 380 nm.

7. The method according to claim 1, further comprising: deploying as the at least one SiC-semiconductor detector, a SiC-semiconductor detector, which carries an anti-reflection layer of SiO$_2$ with a thickness of between 50 and 66 nm.

8. The method according to claim 1,
deploying as the at least one SiC-semiconductor detector, a 4H—SiC-semiconductor detector.

9. The method according to claim 1, further comprising: deploying as the at least one SiC-semiconductor detector, a SiC-semiconductor detector in which the lower semiconductor region is n-doped.

10. The method according to claim 1, further comprising: applying a block voltage on the pn-junction, by means of which the sensitivity of the SiC-semiconductor detector is increased in the wavelength range between 330 and 380 nm.

11. The method according to claim 1, further comprising: deploying in the detector arrangement at least one second detector, which has a maximum sensitivity in the visible spectral range, and
determining from output signals of the SiC-semiconductor detector and the second detector as to whether direct solar radiation is present, or whether solar radiation through a window, or radiation from a light source emitting only in the UV spectral range, or only in the visible spectral range, is present.

12. The method according to claim 11, further comprising:
deploying as the second detector a Si—, GaP— or GaAs semiconductor detector.

13. A SiC-semiconductor detector, in which a lower of two semiconductor regions forming a pn-junction has a dopant concentration of $<1*10^{15}$ cm$^{-3}$, and has a thickness that is greater than 50% of the width of the space-charge zone in thermodynamic equilibrium, with thickness not restricting this semiconductor region.

14. The SiC-semiconductor detector according to claim 13,
characterised in that
the dopant concentration of the lower semiconductor region is $<5*10^{14}$ cm$^{-3}$.

15. The SiC-semiconductor detector according to claim 13,
characterised in that
the thickness of the lower semiconductor region is at least 1.7 μm.

16. The SiC-semiconductor detector according to claim 13,
characterised in that
an upper of the two semiconductor regions forming the pn-junction has a thickness of between 1.5 μm and 3 μm.

17. The SiC-semiconductor detector according to claim 13,
characterised in that
the SiC-semiconductor detector carries an anti-reflection layer for a wavelength range of between 300 and 380 nm.

18. An application of a SiC-semiconductor detector according to claim 13 for the control of the air conditioning system in motor vehicles.

19. An application of a SiC-semiconductor detector according to claim 13 for the registration of an open window in a room.

20. A detector arrangement for the detection of sunlight that has at least one SiC-semiconductor detector according to claim 13, and at least one second detector, which has a maximum sensitivity in the visible spectral range.

21. The detector arrangement according to claim 20, in which a plurality of the SiC-semiconductor detectors and second detectors is arranged in the form of an array.

* * * * *